(12) United States Patent
Lee

(10) Patent No.: US 9,054,258 B2
(45) Date of Patent: Jun. 9, 2015

(54) SEMICONDUCTOR LIGHT EMITTING DEVICE

(71) Applicant: LG INNOTEK CO., LTD., Seoul (KR)

(72) Inventor: Sang Youl Lee, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/789,444

(22) Filed: Mar. 7, 2013

(65) Prior Publication Data

US 2013/0181239 A1 Jul. 18, 2013

Related U.S. Application Data

(63) Continuation of application No. 12/307,198, filed as application No. PCT/KR2007/006582 on Dec. 17, 2007, now abandoned.

(30) Foreign Application Priority Data

Dec. 26, 2006 (KR) .................. 10-2006-0133528

(51) Int. Cl.
| | |
|---|---|
| *H01L 33/00* | (2010.01) |
| *H01L 33/08* | (2010.01) |
| *H01L 33/38* | (2010.01) |
| H01L 33/32 | (2010.01) |
| H01L 33/40 | (2010.01) |
| H01L 33/42 | (2010.01) |

(52) U.S. Cl.
CPC .............. *H01L 33/08* (2013.01); *H01L 33/32* (2013.01); *H01L 33/387* (2013.01); *H01L 33/40* (2013.01); *H01L 33/405* (2013.01); *H01L 33/42* (2013.01)

(58) Field of Classification Search
CPC .......... H01L 21/00; H01L 29/00; H01L 27/00
USPC ............... 257/E33.064, E33.067, 98, 99
See application file for complete search history.

(56) References Cited

U.S. PATENT DOCUMENTS

| 5,414,281 A | 5/1995 | Watabe et al. |
| 7,119,372 B2 | 10/2006 | Stokes et al. |

(Continued)

FOREIGN PATENT DOCUMENTS

| EP | 1 168 460 A2 | 1/2002 |
| EP | 1 278 249 A1 | 1/2003 |

(Continued)

OTHER PUBLICATIONS

Wey, Yih-Guei, Ph.D, "High Speed Double Heterostructure GaInAs/InP p-i-n Photodiodes; Theory, fabrication and measurement" 1993, University of Californial, Santa Barbara, UMI Dissertations Publishing, pp. 1-147.*

(Continued)

*Primary Examiner* — Telly Green
(74) *Attorney, Agent, or Firm* — Birch, Stewart, Kolasch & Birch, LLP

(57) ABSTRACT

Disclosed is a semiconductor light emitting device. The semiconductor light emitting device comprises a first semiconductor layer, a second semiconductor layer, an active layer formed between the first semiconductor layer and the second semiconductor layer, a first reflective electrode on the first semiconductor layer to reflect incident light, and a second reflective electrode on the second semiconductor layer to reflect the incident light.

10 Claims, 3 Drawing Sheets

(56) References Cited

U.S. PATENT DOCUMENTS

| | | |
|---|---|---|
| 7,358,539 B2 | 4/2008 | Venugopalan et al. |
| 7,491,979 B2 | 2/2009 | Kwak et al. |
| 7,501,295 B2 | 3/2009 | Zhou |
| 7,612,384 B2 | 11/2009 | Zhou |
| 7,973,325 B2 | 7/2011 | Kim et al. |
| 8,115,212 B2* | 2/2012 | Miki et al. .................... 257/79 |
| 2004/0026702 A1 | 2/2004 | Yamada et al. |
| 2005/0052878 A1 | 3/2005 | Yamada et al. |
| 2005/0082557 A1 | 4/2005 | Seong et al. |
| 2005/0104077 A1 | 5/2005 | Song et al. |
| 2005/0104080 A1 | 5/2005 | Ichihara et al. |
| 2005/0151136 A1 | 7/2005 | Liu |
| 2006/0012053 A1* | 1/2006 | Lai ............................... 257/778 |
| 2006/0108593 A1 | 5/2006 | Kim et al. |
| 2006/0214574 A1 | 9/2006 | Kawaguchi et al. |
| 2006/0231854 A1 | 10/2006 | Chae et al. |
| 2007/0085089 A1 | 4/2007 | Hsu |
| 2007/0187713 A1 | 8/2007 | Kim |
| 2007/0200493 A1 | 8/2007 | Hsu et al. |
| 2007/0228393 A1 | 10/2007 | Yoneda |
| 2008/0121914 A1 | 5/2008 | Seong et al. |
| 2008/0210957 A1 | 9/2008 | Watanabe et al. |
| 2009/0184329 A1* | 7/2009 | Miki et al. ....................... 257/79 |
| 2010/0006885 A1* | 1/2010 | Gong ............................. 257/99 |

FOREIGN PATENT DOCUMENTS

| | | |
|---|---|---|
| GB | 2 270 199 A | 3/1994 |
| JP | 2004-56109 A | 2/2004 |
| JP | 2005-45038 A | 2/2005 |
| JP | 2006-269912 A | 10/2006 |
| KR | 10-2006-0080337 A | 7/2006 |
| KR | 10-0661711 B1 | 12/2006 |
| WO | WO 2006/011672 A1 | 2/2006 |
| WO | WO 2007/027035 A1 | 3/2007 |

OTHER PUBLICATIONS

English Language Machine Translation of JP 2005-45038.

* cited by examiner

SEMICONDUCTOR LIGHT EMITTING DEVICE

The Application is a Continuation of co-pending application Ser. No. 12/307,198 filed on Dec. 31, 2008, which is the national stage application of International Patent Application No. PCT/KR2007/006582 filed on Dec. 17, 2007, which claims priority of Application No. 10-2006-0133528 filed in the Republic of Korea on Dec. 26, 2006 under 35 U.S.C. 119; the entire contents of all are hereby incorporated by reference.

TECHNICAL FIELD

The embodiment relates to a semiconductor light emitting device.

BACKGROUND ART

A semiconductor light emitting device comprises an LED (light emitting diode), an LD (laser diode) and the like. A semiconductor light emitting device is used to convert electrical signals into infrared rays, visible rays and the like by using the characteristics of a compound semiconductor and to exchange the converted signals.

In general, an LED has been widely used for household electrical appliances, remote controllers, electric light boards, indicators, and various automation devices, and is largely classified as an IRED (infrared emitting diode) and a VLED (visible light emitting diode).

In general, an LED having a small size is fabricated in the form of a surface mount device so that the LED is directly mounted on a PCB (printed circuit board). Accordingly, an LED lamp used as a display device is also fabricated in the form of a surface mount device. Such a surface mount device can replace an existing simple lighting lamp and is used as a lighting indicator producing various colors, a character indicator, an image indicator and the like.

As described above, such a semiconductor light emitting device has been used for various fields, for example, electric lights for daily life, electric lights for outputting rescue signals and the like. Further, demand for a high brightness semiconductor light emitting device has increased more and more. Thus, a high-power light emitting device has been actively developed.

DISCLOSURE

Technical Problem

The embodiment provides a semiconductor light emitting device capable of improving the total light emitting efficiency by preventing light generated from an active layer from being absorbed by electrodes.

Technical Solution

An embodiment provides a semiconductor light emitting device comprising: a first semiconductor layer; a second semiconductor layer; an active layer formed between the first semiconductor layer and the second semiconductor layer; a first reflective electrode on the first semiconductor layer to reflect incident light; and a second reflective electrode on the second semiconductor layer to reflect the incident light.

An embodiment provides a semiconductor light emitting device comprising: a first semiconductor layer; a second semiconductor layer; an active layer formed between the first semiconductor layer and the second semiconductor layer; a first electrode on the first semiconductor layer; and a second electrode on the second semiconductor layer, wherein at least one of the first electrode and the second electrode is divided into a plurality of electrodes.

Advantageous Effects

According to the embodiment, light generated from an active layer is prevented from being absorbed by electrodes, so that the total light emitting efficiency can be improved.

MODE FOR INVENTION

In the description of an embodiment, it will be understood that, when a layer (or film), a region, a pattern, or a structure is referred to as being "on" ⊙ or "under" ⊙ another substrate, another layer (or film), another region, another pad, or another pattern, it can be "directly" or "indirectly" on the other substrate, layer (or film), region, pad, or pattern, or one or more intervening layers may also be present.

Hereinafter, embodiments will be described with reference to the accompanying drawings.

Figure 1:
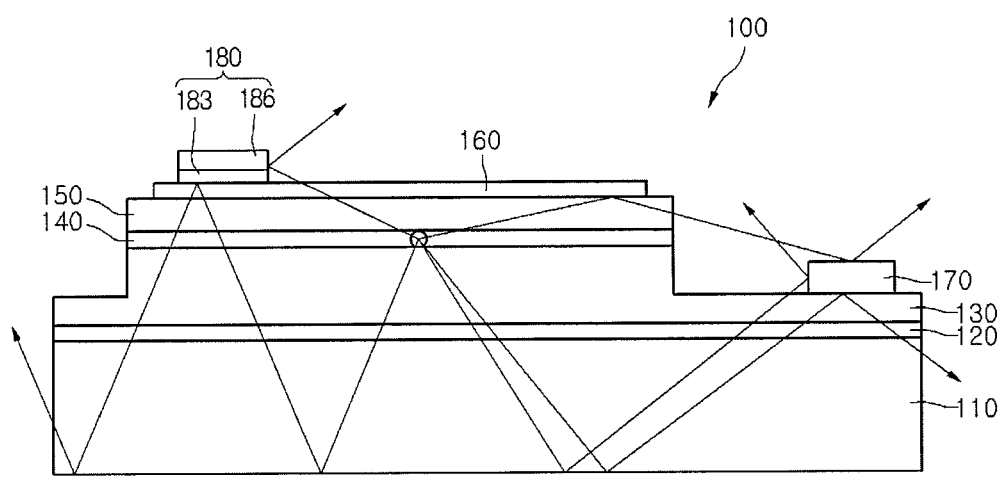
FIG. 1 is a sectional view schematically showing the stack structure of a semiconductor light emitting device according to a first embodiment.

FIG. 1 is a sectional view schematically showing the stack structure of a semiconductor light emitting device according to a first embodiment.

As shown in FIG. 1, the semiconductor light emitting device 100 according to the first embodiment comprises a substrate 110, a buffer layer 120, a first semiconductor layer for example, an n-type semiconductor layer 130, an active layer 140, a second semiconductor layer for example, a p-type semiconductor layer 150, a transparent electrode 160, a first reflective electrode for example, an n-type reflective electrode 170, and a second reflective electrode for example, a p-type reflective electrode 180.

First, the substrate 110 is formed of one selected from the group consisting of $Al_2O_3$, Si, SiC, GaAs, ZnO, MgO or a compound thereof.

The buffer layer 120 may have a stack structure such as AlInN/GaN, $In_xGa_{1-x}N$/GaN, $Al_xIn_yGa_{1-x-y}N$/$In_xGa_{1-x}N$/GaN and the like.

The n-type semiconductor layer 130 and the p-type semiconductor layer 150 may comprise nitride semiconductor layers, respectively.

The active layer 140 is formed between the n-type semiconductor layer 130 and the p-type semiconductor layer 150.

The active layer 140 may have a single quantum well structure or a multi-quantum well structure.

The transparent electrode 160 is formed on the p-type semiconductor layer 150. The transparent electrode 160 comprises materials that have superior light transmittance and increase diffusion of electric current. The transparent electrode 160 may be formed of transparent conductive oxide layer, such as ITO, CTO, $SnO_2$, ZnO, $RuO_x$, $TiO_x$, $IrO_x$ or $Ga_xO_y$.

The p-type reflective electrode 180 is formed on the transparent electrode 160, and the n-type reflective electrode 170 is formed on the n-type semiconductor layer 130.

The p-type reflective electrode 180 and the n-type reflective electrode 170 comprise metal containing reflective material to serve as a bonding pad. The p-type reflective electrode 180 and the n-type reflective electrode 170 comprise reflective material such as Ag or Al to have a single layer structure or a multi-layer structure.

Further, the transparent electrode 160 and the n-type reflective electrode 170 serve as an ohmic contact layer.

For example, the n-type reflective electrode 170 can be formed with an ohmic contact layer by using reflective material such as Al. Further, the n-type reflective electrode 170 can be formed with an ohmic contact layer by using Ti, Cr and the like. Furthermore, the n-type reflective electrode 170 may have a thickness less than several nm in order to increase the reflectivity of a reflective layer.

Further, the transparent electrode 160 is located below the p-type reflective electrode 180. The transparent electrode 160 serves as an ohmic contact layer. Accordingly, the p-type reflective electrode 180 can serve as a reflective layer. In addition, the p-type reflective electrode 180 can be prepared in the form of a bonding pad, in which an ohmic contact layer 183 is formed by Ti or Cr having a thickness less than several nm and a reflective layer 186 is additionally formed.

According to the semiconductor light emitting device 100 of the first embodiment as described above, the n-type and p-type reflective electrodes 170 and 180 are provided thereto, so that the light generated from the active layer 140 can be prevented from being absorbed by the n-type and p-type reflective electrodes 170 and 180. The light generated from the active layer 140 is reflected from the side or bottom surfaces of the n-type and p-type reflective electrodes 170 and 180 instead of being absorbed by the n-type and p-type reflective electrodes 170 and 180.

Accordingly, the semiconductor light emitting device 100 of the first embodiment can improve the brightness thereof. Further, the semiconductor light emitting device 100 of the first embodiment can be applied to a low-power semiconductor light emitting device as well as a high-power semiconductor light emitting device.

Meanwhile, the embodiment proposes a scheme for dividing a reflective electrode in order to further improve the brightness of the semiconductor light emitting device. FIGS. 2 to 5 show an example of the semiconductor light emitting device comprising divided reflective electrodes.

As shown in FIGS. 2 to 5, when dividing a reflective electrode, either an n-type reflective electrode or a p-type reflective electrode can be divided, or both the n-type reflective electrode and the p-type reflective electrode can also be divided. Further, the divided n-type reflective electrodes are electrically interconnected, and the divided p-type reflective electrodes are also electrically interconnected. For example, the divided n-type reflective electrodes can be patterned on the same plane and the divided p-type reflective electrodes can also be patterned on the same plane.

Figure 2:
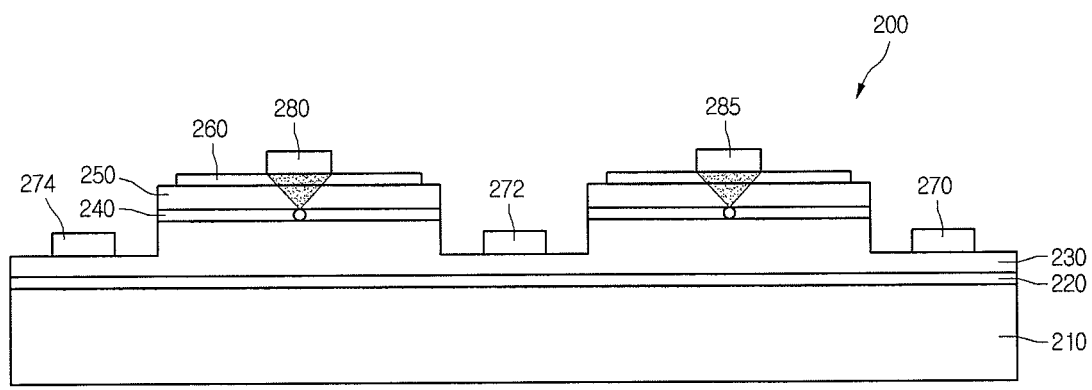
FIG. 2 is a sectional view schematically showing the stack structure of a semiconductor light emitting device according to a second embodiment.

FIG. 2 is a sectional view schematically showing the stack structure of a semiconductor light emitting device according to a second embodiment.

As shown in FIG. 2, the semiconductor light emitting device 200 according to the second embodiment comprises a substrate 210, a buffer layer 220, an n-type semiconductor layer 230, an active layer 240, a p-type semiconductor layer 250, a transparent electrode 260, p-type reflective electrodes 280 and 285, and n-type reflective electrodes 270, 272 and 274.

According to the semiconductor light emitting device 200 of the second embodiment, two p-type reflective electrodes 280 and 285 and three n-type reflective electrodes 270, 272 and 274 are formed.

The two p-type reflective electrodes 280 and 285 formed through division are electrically interconnected. According to one example, the two p-type reflective electrodes 280 and 285 can be patterned on the same plane in the form of a substantial '⊏' shape.

Further, the three n-type reflective electrodes 270, 272 and 274 formed through division are electrically interconnected. The three n-type reflective electrodes 270, 272 and 274 can be patterned on the same plane.

The two p-type reflective electrodes 280 and 285 are formed on the transparent electrode 260, and the three n-type reflective electrodes 270, 272 and 274 are formed on the n-type semiconductor layer 230.

As described above, the two p-type reflective electrodes 280 and 285 and the three n-type reflective electrodes 270, 272 and 274 are formed through division, so that various light paths can be ensured even when an area, in which the reflective electrodes are formed in the second embodiment, is equal to that in which the reflective electrodes are formed in the first embodiment. Accordingly, the light generated from the active layer 240 can be more efficiently emitted to the upward direction. As a result, the brightness of the semiconductor light emitting device comprising the divided reflective electrodes can be increased more and more.

The second embodiment shows an example in which the electrodes formed through division are reflective electrodes. However, the electrodes formed through division may be typical electrodes, other than the reflective electrodes, which are applied to fields related to a semiconductor light emitting device.

Figure 3:
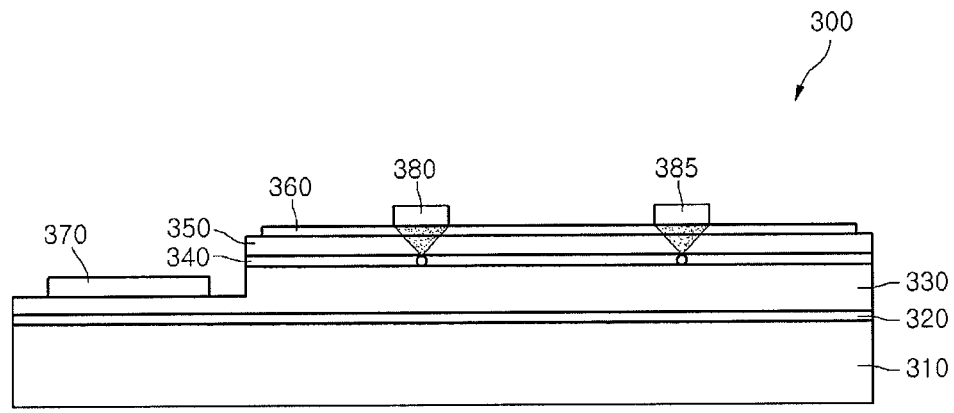
FIG. 3 is a sectional view schematically showing the stack structure of a semiconductor light emitting device according to a third embodiment.

FIG. 3 is a sectional view schematically showing the stack structure of a semiconductor light emitting device according to a third embodiment.

As shown in FIG. 3, the semiconductor light emitting device 300 according to the third embodiment comprises a substrate 310, a buffer layer 320, an n-type semiconductor layer 330, an active layer 340, a p-type semiconductor layer 350, a transparent electrode 360, p-type reflective electrodes 380 and 385, and an n-type reflective electrode 370.

According to the semiconductor light emitting device 300 of the third embodiment, two p-type reflective electrodes 380 and 385 and one n-type reflective electrode 370 are formed.

The two p-type reflective electrodes 380 and 385 formed through division are electrically interconnected. According to one example, the two p-type reflective electrodes 380 and 385 can be patterned on the same plane in the form of a substantial '⊏' shape.

The two p-type reflective electrodes 380 and 385 are formed on the transparent electrode 360, and the one n-type reflective electrode 370 is formed on the n-type semiconductor layer 330.

As described above, the two p-type reflective electrodes 380 and 385 are formed through division, so that various light paths can be ensured and the light generated from the active layer 340 can be more efficiently emitted to the upward direction. Accordingly, the brightness of the semiconductor light emitting device comprising the divided reflective electrodes can be increased more and more.

The third embodiment shows an example in which the electrodes formed through division are reflective electrodes. However, the electrodes formed through division may be typical electrodes, other than the reflective electrodes, which are applied to fields related to a semiconductor light emitting device.

Figure 4:
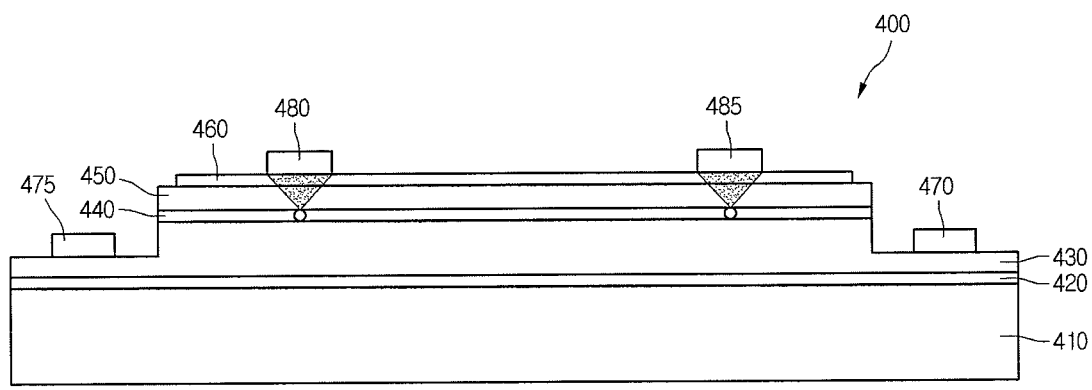
FIG. 4 is a sectional view schematically showing the stack structure of a semiconductor light emitting device according to a fourth embodiment.

FIG. 4 is a sectional view schematically showing the stack structure of a semiconductor light emitting device according to a fourth embodiment.

As shown in FIG. 4, the semiconductor light emitting device 400 according to the fourth embodiment comprises a substrate 410, a buffer layer 420, an n-type semiconductor layer 430, an active layer 440, a p-type semiconductor layer 450, a transparent electrode 460, p-type reflective electrodes 480 and 485, and n-type reflective electrodes 470 and 475.

According to the semiconductor light emitting device 400 of the fourth embodiment, two p-type reflective electrodes 480 and 485 and two n-type reflective electrodes 470 and 475 are formed.

The two p-type reflective electrodes 480 and 485 formed through division are electrically interconnected. According to one example, the two p-type reflective electrodes 480 and 485 can be patterned on the same plane in the form of a substantial '⊏' shape.

The two n-type reflective electrodes 470 and 475 formed through division are electrically interconnected. The two n-type reflective electrodes 470 and 475 can be patterned on the same plane in the form of a substantial '⊏' shape.

The two p-type reflective electrodes 480 and 485 are formed on the transparent electrode 460, and the two n-type reflective electrodes 470 and 475 are formed on the n-type semiconductor layer 430.

As described above, the two p-type reflective electrodes 480 and 485 and the two n-type reflective electrodes 470 and 475 are formed through division, so that various light paths can be ensured and the light generated from the active layer 440 can be more efficiently emitted to the upward direction. Accordingly, the brightness of the semiconductor light emitting device comprising the divided reflective electrodes can be increased more and more.

The fourth embodiment shows an example in which the electrodes formed through division are reflective electrodes. However, the electrodes formed through division may also comprise typical electrodes, other than the reflective electrodes, which are applied to fields related to a semiconductor light emitting device.

Figure 5:
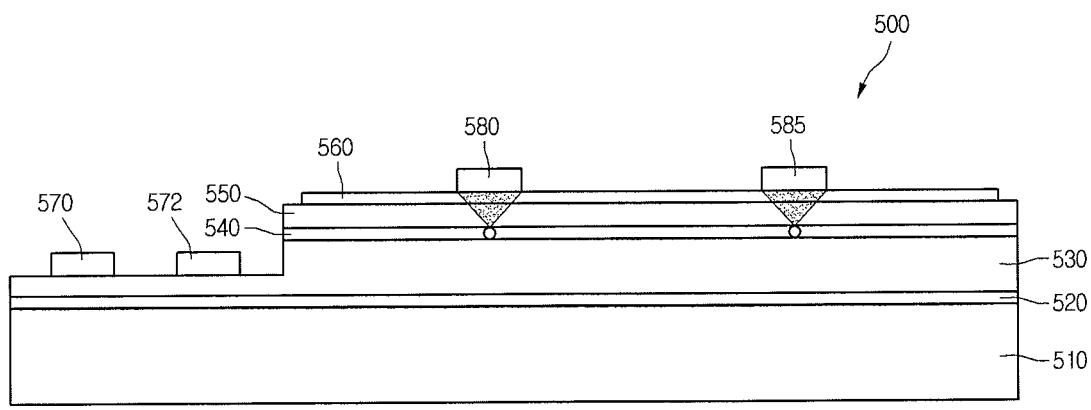
FIG. 5 is a sectional view schematically showing the stack structure of a semiconductor light emitting device according to a fifth embodiment.

FIG. 5 is a sectional view schematically showing the stack structure of a semiconductor light emitting device according to a fifth embodiment.

As shown in FIG. 5, the semiconductor light emitting device 500 according to the fifth embodiment comprises a substrate 510, a buffer layer 520, an n-type semiconductor layer 530, an active layer 540, a p-type semiconductor layer 550, a transparent electrode 560, p-type reflective electrodes 580 and 585, and n-type reflective electrodes 570 and 572.

According to the semiconductor light emitting device 500 of the fifth embodiment, two p-type reflective electrodes 580 and 585 and two n-type reflective electrodes 570 and 572 are formed.

The two p-type reflective electrodes 580 and 585 formed through division are electrically interconnected. According to one example, the two p-type reflective electrodes 580 and 585 can be patterned on the same plane in the form of a substantial '⊏' shape.

The two n-type reflective electrodes 570 and 572 formed through division are electrically interconnected. The two n-type reflective electrodes 570 and 572 can be patterned on the same plane in the form of a substantial '⊏' shape.

The two p-type reflective electrodes 580 and 585 are formed on the transparent electrode 560, and the two n-type reflective electrodes 570 and 572 are adjacently formed on the n-type semiconductor layer 530.

As described above, the two p-type reflective electrodes 580 and 585 and the two n-type reflective electrodes 570 and 572 are formed through division, so that various light paths can be ensured and the light generated from the active layer 540 can be more efficiently emitted to the upward direction. Accordingly, the brightness of the semiconductor light emitting device comprising the divided reflective electrodes can be increased more and more.

The fifth embodiment shows an example in which the electrodes formed through division are reflective electrodes. However, the electrodes formed through division may be typical electrodes, other than the reflective electrodes, which are applied to fields related to a semiconductor light emitting device.

Figure 6:
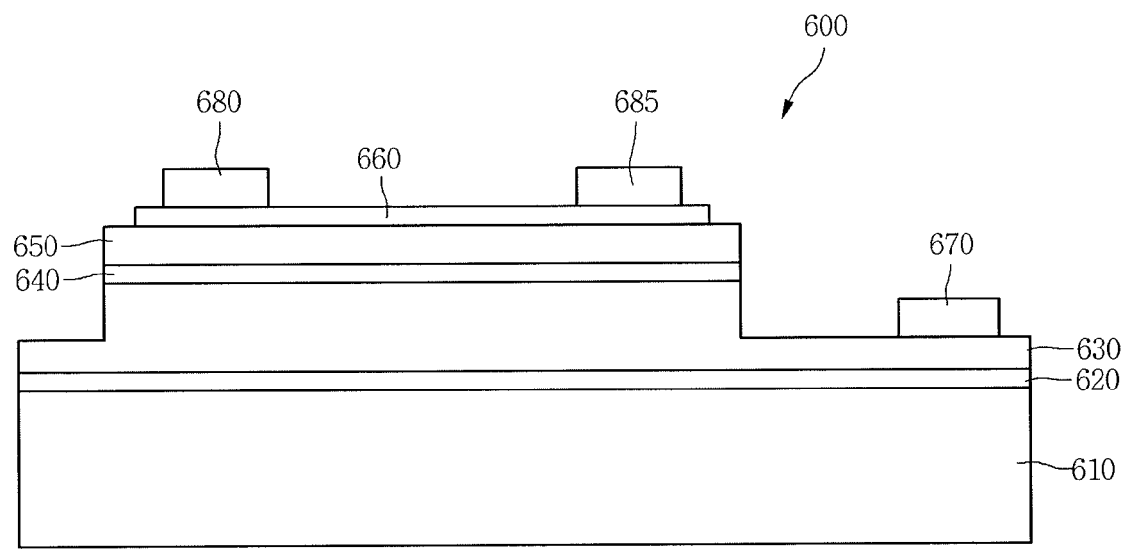
FIG. 6 is a sectional view schematically showing the stack structure of a semiconductor light emitting device according to a sixth embodiment.

FIG. 6 is a sectional view schematically showing the stack structure of a semiconductor light emitting device according to a sixth embodiment.

As shown in FIG. 6, the semiconductor light emitting device 600 according to the sixth embodiment comprises a substrate 610, a buffer layer 620, an n-type semiconductor layer 630, an active layer 640, a p-type semiconductor layer 650, a transparent electrode 660, p-type reflective electrodes 680 and 685, and an n-type reflective electrode 670.

According to the semiconductor light emitting device 600 of the sixth embodiment, two p-type reflective electrodes 680 and 685 and one n-type reflective electrodes 670 are formed.

The two p-type reflective electrodes 680 and 685 formed through division are electrically interconnected. According to one example, the two p-type reflective electrodes 680 and 685 can be patterned on the same plane in the form of a substantial '⊏' shape.

The two p-type reflective electrodes 680 and 685 are formed on the transparent electrode 660, and the n-type reflective electrode 670 is formed on the n-type semiconductor layer 630.

As described above, the two p-type reflective electrodes 680 and 685 and the n-type reflective electrode 670 are formed so that various light paths can be ensured and the light generated from the active layer 640 can be more efficiently emitted to the upward direction. Accordingly, the brightness of the semiconductor light emitting device comprising the reflective electrodes can be increased more and more.

The sixth embodiment shows an example in which the electrodes formed through division are reflective electrodes. However, the electrodes formed through division may be typical electrodes, other than the reflective electrodes, which are applied to fields related to a semiconductor light emitting device.

According to the embodiments as described above, the number of the reflective electrodes formed through division is two or three. However, the number of the reflective electrodes formed through division can be varied according to the design thereof.

Further, the embodiments show an example of the P-N junction semiconductor light emitting device in which the p-type semiconductor layer is formed on the n-type semiconductor layer. However, the embodiment can be applied to an N-P-N junction semiconductor light emitting device in which an n-type semiconductor layer is additionally formed on the p-type semiconductor layer. The N-P-N junction semiconductor light emitting device denotes a semiconductor light emitting device in which both first and second electrode layers are provided as n-type semiconductor layers, and a p-type semiconductor layer is formed between the n-type semiconductor layers. At this time, a first electrode is formed on the first electrode layer, which is the n-type semiconductor layer, while making contact with the first electrode layer. A second electrode is formed on the second electrode layer, which is the n-type semiconductor layer, while making contact with the second electrode layer.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Industrial Applicability

According to the embodiments as described above, the semiconductor light emitting device comprises a plurality of divided reflective electrodes as electrodes, so that the light generated from the active layer can be transmitted in the upward direction through gaps between the electrodes or reflected from the electrodes instead of being absorbed by the electrodes. Consequently, the total light emitting efficiency of the semiconductor light emitting device can be improved.

The invention claimed is:

1. A semiconductor light emitting device comprising:
   a substrate;
   a light emitting structure on the substrate comprising a first semiconductor layer including a first portion, a second portion and a third portion, an active layer on the first portion of the first semiconductor layer, and a second semiconductor layer on the active layer;
   a transparent electrode layer on the second semiconductor layer of the light emitting structure;
   a first electrode on a second portion of the first semiconductor layer; and
   a second electrode on the transparent electrode layer,
   wherein the transparent electrode layer has a single layer having a transparent conductive oxide layer,
   wherein the second electrode comprises a metal layer and a reflective layer disposed on the metal layer, the metal layer directly contacting at least a portion of a top surface of the single layer,
   wherein the second portion and the third portion of the first semiconductor layer do not overlap with the active layer in a vertical direction,
   wherein the first electrode is not on the third portion of the first semiconductor layer,
   wherein a width of the third portion is narrower than a width of the second portion,
   wherein the transparent electrode layer has a first top surface on which the metal layer is disposed and a second top surface on which the metal layer is not disposed such that light from the active layer is emitted toward the outside through the second top surface of the transparent electrode layer,
   wherein the second electrode comprises two or more divided parts, at least portions of the two or more divided parts of the second electrode being spaced apart from each other, and
   wherein at least a portion of the second electrode directly contacts the transparent electrode layer.

2. The semiconductor light emitting device according to claim 1, wherein the transparent electrode layer includes at least one selected from the group consisting of $RuO_x$, $TiO_x$, $IrO_x$, and $Ga_xO_y$.

3. The semiconductor light emitting device according to claim 1, wherein the metal layer includes at least one of Ti or Cr.

4. The semiconductor light emitting device according to claim 1, wherein the first electrode includes a first layer including Ag or Al and a second layer including Ti or Cr.

5. A semiconductor light emitting device comprising:
   a substrate;
   a light emitting structure on the substrate comprising a first semiconductor layer including a first portion and a second portion, an active layer on the first portion of the first semiconductor layer, and a second semiconductor layer on the active layer;
   a transparent electrode layer on the second semiconductor layer of the light emitting structure;
   a first electrode on a second portion of the first semiconductor layer; and
   a second electrode comprising two or more divided parts, the divided parts of the second electrode configured to electrically interconnect to each other,
   wherein the transparent electrode layer includes an ITO material, wherein at least portions of the two or more divided parts of the second electrode are configured to directly contact the transparent electrode layer, and
   wherein the divided parts of the second electrode comprise a metal layer and a reflective electrode disposed on the metal layer, the metal layer directly contacting at least a portion of a top surface of the transparent electrode layer,
   wherein the first electrode includes two or more divided parts,
   wherein at least portions of the two or more divided parts of the first electrode are spaced apart from each other, and
   wherein at least portions of the two or more divided parts of the second electrode are spaced apart from each other.

6. The semiconductor light emitting device according to claim 5, wherein the metal layer includes at least one of Ti or Cr.

7. The semiconductor light emitting device according to claim 5, wherein the two or more divided parts of the first electrode are electrically interconnected to each other.

8. The semiconductor light emitting device according to claim 1, wherein a distance from a side of the light emitting structure to the first electrode is greater than a width of the first electrode.

9. The semiconductor light emitting device according to claim 1, wherein the first portion of the first semiconductor layer is disposed between the second portion and the third portion of the first semiconductor layer.

10. The semiconductor light emitting device according to claim 1, wherein the second electrode has a first divided part and a second divided part, the first divided part being near an edge of the transparent electrode layer and the second divided part being near another edge of the transparent electrode layer, and wherein a distance between the first divided part and the second divided part is greater than a distance between one of the first divided part and a side surface of the transparent electrode layer.

* * * * *